United States Patent
Lee et al.

(10) Patent No.: US 12,356,643 B2
(45) Date of Patent: Jul. 8, 2025

(54) CAPACITOR, MEMORY DEVICE INCLUDING THE CAPACITOR

(71) Applicant: Samsung Electronics Co., Ltd., Suwon-si (KR)

(72) Inventors: Changsoo Lee, Seoul (KR); Jinhong Kim, Seoul (KR); Yongsung Kim, Suwon-si (KR); Jiwoon Park, Seoul (KR); Jooho Lee, Hwaseong-si (KR); Yong-Hee Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/715,473

(22) Filed: Apr. 7, 2022

(65) Prior Publication Data
US 2023/0102906 A1 Mar. 30, 2023

(30) Foreign Application Priority Data
Sep. 28, 2021 (KR) .................. 10-2021-0128351

(51) Int. Cl.
*H10B 12/00* (2023.01)
*H10D 1/68* (2025.01)

(52) U.S. Cl.
CPC ............. *H10D 1/696* (2025.01); *H10B 12/31* (2023.02)

(58) Field of Classification Search
CPC ... H01L 28/75; H01L 28/65; H01L 21/02697; H01L 21/02186; H01L 21/02304; H01L 21/7687; H01L 28/40; H01L 28/92; H01L 21/76841; H01L 28/57; H10B 12/31; H10B 12/315; H10B 53/30; H10B 12/03; H10B 12/30; H10B 12/318; C23C 16/405; C23C 16/45525
See application file for complete search history.

(56) References Cited

U.S. PATENT DOCUMENTS 6,607,963 B2 * 8/2003 Kim .................... H01L 21/0234
257/E21.268
6,608,383 B2 * 8/2003 Yokoyama ............. H10B 53/30
257/295
2012/0309163 A1 12/2012 Kiyomura et al.
(Continued)

FOREIGN PATENT DOCUMENTS

JP          4984134 B2 *  7/2012
JP       2012-248813 A   12/2012
(Continued)

OTHER PUBLICATIONS

J.A. Kittl et al, "High-k dielectrics for future generation memory devices" Microelectronic Engineering, 86, 1789-1795, Mar. 13, 2009.
J. H. Shim et al, "Process.property relationship in high-k ALD SrTiO3 and BaTiO3:a review"J. Mater. Chem. C, 5, 8000-8013, Jun. 8, 2017.
(Continued)

*Primary Examiner* — Shouxiang Hu
(74) *Attorney, Agent, or Firm* — Harness, Dickey & Pierce, P.L.C.

(57) ABSTRACT

A capacitor includes a lower electrode layer including a first conductive layer and a second conductive layer on the first conductive layer, the second conductive layer including $SnO_2$ doped with an impurity; a dielectric layer on the second conductive layer, the dielectric layer including a rutile-phase oxide; and an upper electrode layer on the dielectric layer.

12 Claims, 9 Drawing Sheets

(56) References Cited

U.S. PATENT DOCUMENTS

| | | | |
|---|---|---|---|
| 2013/0093051 A1 | 4/2013 | Chen et al. | |
| 2013/0119515 A1* | 5/2013 | Ramani | H10N 70/253 257/532 |
| 2013/0320495 A1 | 12/2013 | Malhotra et al. | |
| 2014/0170833 A1* | 6/2014 | Rui | H01L 28/75 438/396 |
| 2016/0197136 A1 | 7/2016 | Oh et al. | |
| 2017/0117282 A1 | 4/2017 | Mathur et al. | |

FOREIGN PATENT DOCUMENTS

| | | | |
|---|---|---|---|
| KR | 10-2007-0040714 A | 4/2007 | |
| KR | 10-2010-0078496 A | 7/2010 | |
| KR | 10-2016-0084895 A | 7/2016 | |
| KR | 10-1892632 B1 | 10/2018 | |
| WO | WO 2014119645 A1 * | 8/2014 | |

OTHER PUBLICATIONS

Seong Keun Kim et al.,"Impact of Bimetal Electrodes on Dielectric Properties of TiO2 and Al-Doped TiO2 Films" ACS Appl.Mater. Inter, 4726-4730,Aug. 6, 2012.

Cheol Jin Cho et al, "Ta-Doped SnO2 as a reduction resistant oxide electrode for DRAM capacitors,"J. Mater. Chem. C, 5, 9405-9411, Aug. 22, 2017.

Yuchao Li et al, "Improved mechanical and dielectric performances of epoxy nanocomposites filled with aminated polyethylene glycol grafted graphene," Mater. Lett.,vol. 246, pp. 149-152, Mar. 18, 2019.

Dong-Kwon Lee et al., "Growth of rutile-TiO2 thin films via Sn doping and insertion of ultra-thin SnO2 interlayer by atomic layer deposition," Materials Letters, vol. 246, pp. 1-4, Mar. 9, 2019.

Notice of Non-Final Rejection issued Nov. 29, 2023 in Korean Application No. 10-2021-0128351.

* cited by examiner

CAPACITOR, MEMORY DEVICE INCLUDING THE CAPACITOR

CROSS-REFERENCE TO RELATED APPLICATION

This application is based on and claims priority under 35 U.S.C. § 119 to Korean Patent Application No. 10-2021-0128351, filed on Sep. 28, 2021, in the Korean Intellectual Property Office, the disclosure of which is incorporated by reference herein in its entirety.

BACKGROUND

1. Field

The present disclosure relates to capacitors, memory devices including the capacitor, and methods of manufacturing the capacitor, and more particularly, to capacitors including a rutile-phase dielectric layer having a high permittivity, a memory device including the capacitor, and a method of manufacturing the capacitor.

2. Description of the Related Art

Due to the recent rapid progress toward and to increase in demand for high functionality, high efficiency, compact size, and lightweight of electronic devices, the compact size and high functionality of electronic parts is also rapidly progressing, and electronic parts requiring high reliability are also increasingly employed.

An example of the above electronic parts is a capacitor having a metal/insulator/metal (MIM) structure. Realization of the high capacitance of a capacitor requires a sufficient permittivity related to the amount of charge that can be stored per unit area of a dielectric for capacitors. In accordance with the trend towards the integration of electronic parts, structural improvements have been made not only through improvement of material properties but also through improvement of process capabilities, and, under the current situation where the improvement in the physical structure of electronic parts has neared its limit, development of new materials which enable implementation of the material properties that are beyond the previously used ones is called for.

To provide materials having high permittivity (e.g., to replace silicon oxide, aluminum oxide, and/or the like, which have been used as a dielectric for capacitors), research into binary oxides such as hafnium dioxide ($HfO_2$), zirconium oxide ($ZrO_2$), tantalum oxide ($Ta_2O_5$), titanium dioxide ($TiO_2$), and/or the like and/or perovskite-based oxides corresponding to ternary systems such as strontium titanate ($SrTiO_3$) and $(Ba,Sr)TiO_3$ or systems including more than three components is being conducted.

For example, a binary oxide such as titanium dioxide ($TiO_2$) may have a high permittivity when the oxide maintains a rutile phase. In order to secure the high permittivity of an oxide dielectric layer as above (and/or the consistency of the electronic part), it is necessary to maintain the rutile phase of the dielectric layer, and to this end, a lower electrode on which the dielectric layer is deposited is also to be formed of a material of a rutile phase as well.

A conductive nitride material, which is currently widely used as a material for an electrode layer, may cause (and/or promote) an anatase phase of an oxide dielectric layer to be subsequently deposited, which may reduce the permittivity of the dielectric layer. Therefore, materials for the electrode layer, $RuO_2$, $IrO_2$, impurity-doped $SnO_2$ or the like, which have a rutile phase, may be used in the electrodes. However, in a memory device structure, when the lower electrode layer comes into contact with a contact structure including a metal, the contact structure may be oxidized, thereby increasing the interface resistance, and accordingly, the overall reliability of the memory device may be deteriorated.

SUMMARY

Provided are capacitors including a lower electrode layer having a double-layer structure in which a second conductive layer including impurity-doped $SnO_2$ is stacked on a first conductive layer, memory devices including the capacitors, and methods of manufacturing the capacitors.

Additional aspects will be set forth in part in the description which follows and, in part, will be apparent from the description, or may be learned by practice of the presented embodiments of the disclosure.

According to an aspect of an example embodiment, a capacitor includes a lower electrode layer including a first conductive layer and a second conductive layer on the first conductive layer, the second conductive layer including $SnO_2$ doped with an impurity; a dielectric layer on the second conductive layer, the dielectric layer including a rutile-phase oxide; and an upper electrode layer on the dielectric layer.

The impurity may include at least one of tantalum (Ta), niobium (Nb), manganese (Mn), antimony (Sb), or fluorine (F).

A doping concentration of the impurity with respect to the second conductive layer may be included in a range from 0.5 at % to 10 at %.

A work function of the second conductive layer may be greater than a work function of the first conductive layer.

A work function of the second conductive layer may be included in a range from 4.3 eV to 5 eV.

A thickness of the second conductive layer may be included in a range from 1 nm to 100 nm.

A resistivity of the second conductive layer may be included in a range from 10 μΩcm to 4000 μΩcm.

A sum of a thickness of the first conductive layer and a thickness of the second conductive layer may be less than 10 nm.

A permittivity of the dielectric layer may be included in a range from 60 to 100.

The rutile-phase oxide may include titanium dioxide ($TiO_2$).

The rutile-phase oxide may include titanium dioxide ($TiO_2$) and the dielectric layer may be doped with at least one of aluminum (Al), gallium (Ga), germanium (Ge), lanthanum (La), or yttrium (Y).

The first conductive layer may include titanium nitride (TiN).

The first conductive layer may include titanium nitride (TiN) doped with at least one of vanadium (V), niobium (Nb), tantalum (Ta), chromium (Cr), molybdenum (Mo), tungsten (W), platinum (Pt), rubidium (Ru), or iridium (Ir).

According to an aspect of another embodiment, a memory device includes a transistor including a source region and a drain region spaced apart from each other, a channel region between the source region and the drain region, and a gate electrode on the channel region; a capacitor comprising a lower electrode layer including a first conductive layer and a second conductive layer on the first conductive layer, the second conductive layer including $SnO_2$ doped with an impurity, a dielectric layer on the second conductive layer, the dielectric layer including a rutile-phase oxide, and an upper electrode on the dielectric layer electrically connected to the drain region; and a contact plug electrically connecting the first conductive layer of the lower electrode to at least one of the drain region or the source region.

The impurity may include at least one of tantalum (Ta), niobium (Nb), manganese (Mn), antimony (Sb), or fluorine (F).

A doping concentration of the impurity with respect to the second conductive layer may be included in a range from 0.5 at % to 10 at %.

The first conductive layer may include titanium nitride (TiN).

According to an aspect of another embodiment, a method of manufacturing a capacitor, includes forming a first conductive layer on a substrate; forming, on the first conductive layer, a second conductive layer, the second conductive layer including $SnO_2$ doped with an impurity; forming, on the second conductive layer, a dielectric layer, the dielectric layer including a rutile-phase oxide; and forming an upper electrode layer on the dielectric layer.

The forming the dielectric layer may include an atomic layer deposition (ALD) process, and a temperature of the ALD process may be from about 300° C. to about 340° C.

The impurity may include at least one of tantalum (Ta), niobium (Nb), manganese (Mn), antimony (Sb), or fluorine (F).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
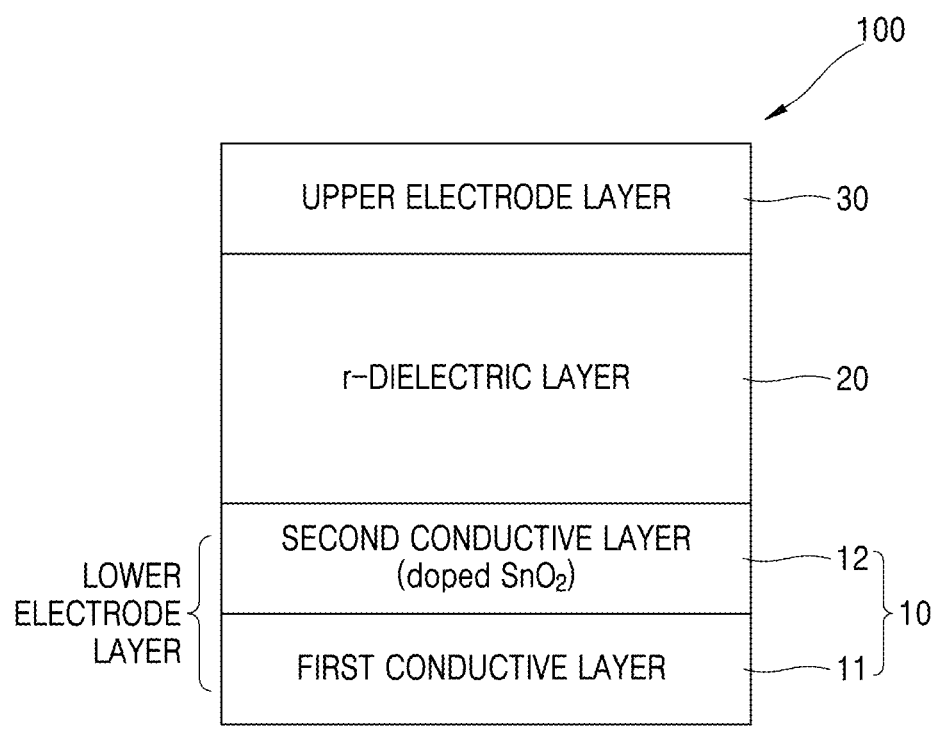
FIG. 1 schematically illustrates an example configuration of a capacitor according to some example embodiments.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the drawings, the size or thickness of each element may be exaggerated for clarity of description. When the terms "about" or "substantially" are used in this specification in connection with a numerical value, it is intended that the associated numerical value includes a manufacturing tolerance (e.g., ±10%) around the stated numerical value.

It will be understood that, although the terms "first," "second," etc. may be used herein to describe various elements. These terms are only used to distinguish one element from another, and these elements should not be otherwise limited by these terms.

Spatially relative terms, such as "upper," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly. It will also be understood that when an element is referred to as being "on" or "above" another element, the element may be in direct contact with the other element or other intervening elements may be present. The singular forms include the plural forms unless the context clearly indicates otherwise.

It should be understood that when a part "comprises" or "includes" an element in the specification, unless otherwise defined, other elements are not excluded from the part and the part may further include other elements.

The use of the term "the" and similar referents in are to be construed to cover both the singular and the plural. The use of any and all examples, or exemplary language provided herein, is intended merely to better illuminate the present disclosure and does not pose a limitation on the scope of the present disclosure unless otherwise claimed.

Finally, the steps of all methods described herein can be performed in any suitable order unless explicitly stated that they must be performed in the order described.

Figure 2:
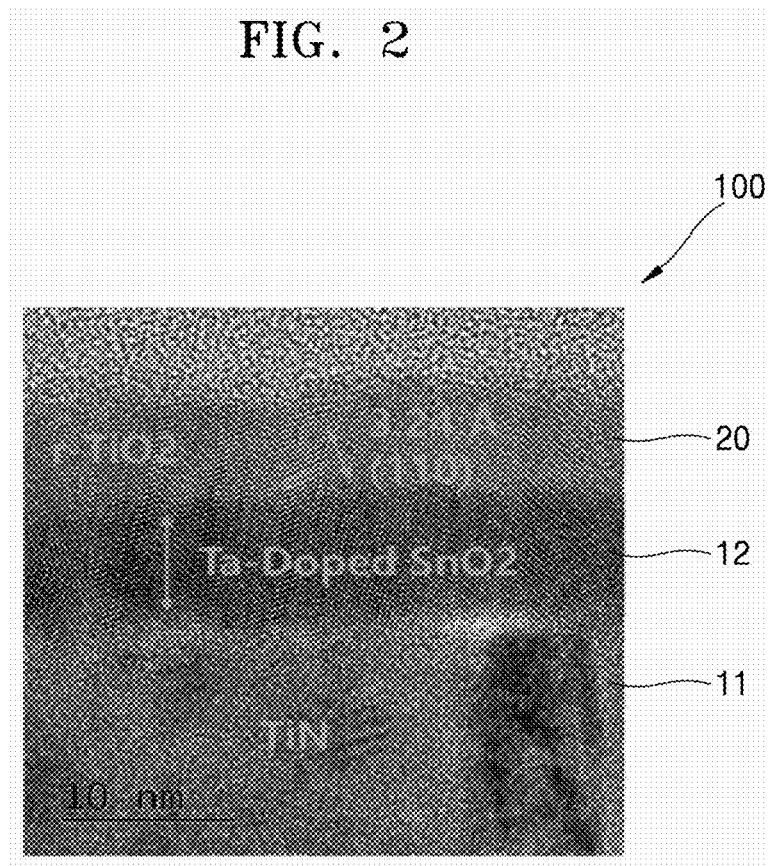
FIG. 2 is a transmission electron microscope (TEM) image of an example configuration of the capacitor of FIG. 1.
Figure 3:
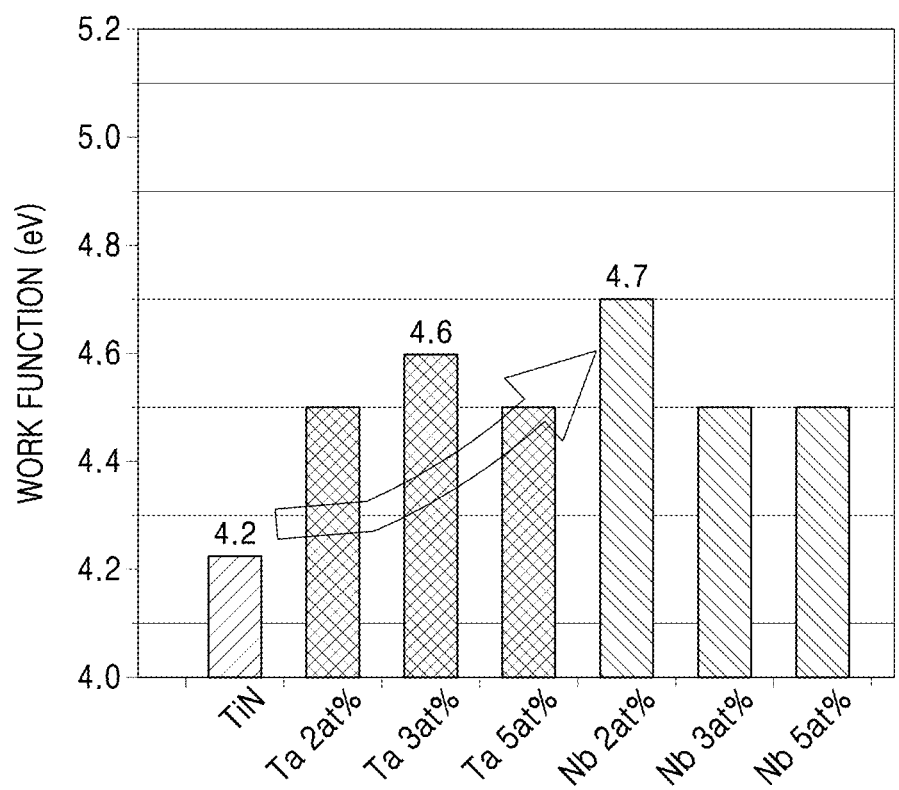
FIG. 3 is a graph showing a variation in a work function of a lower electrode layer according to types of materials included in a second conductive layer of FIG. 1.
Figure 4:
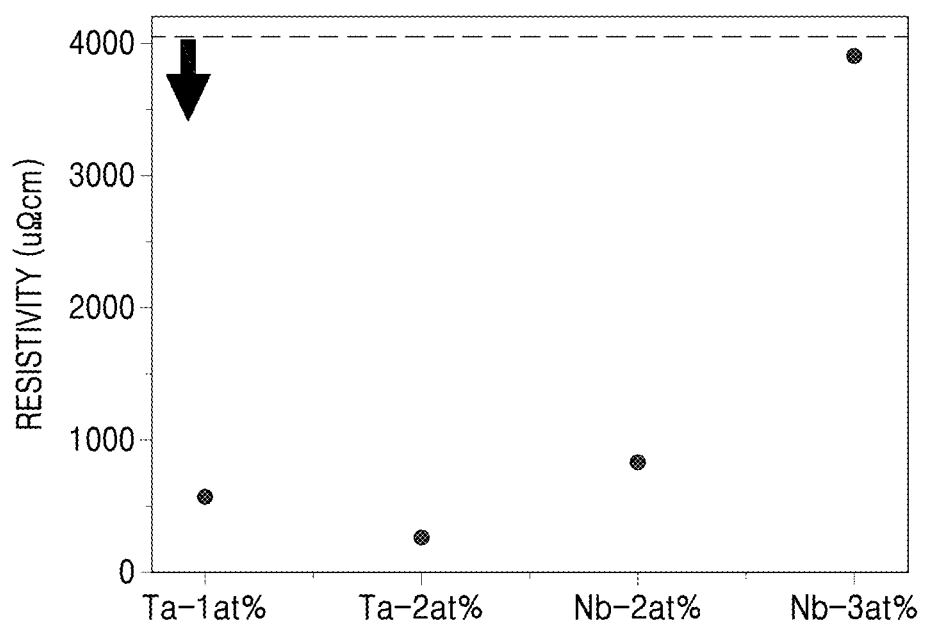
FIG. 4 is a graph for describing variation in resistivity of the second conductive layer of FIG. 1 according to types of materials included in the second conductive layer.
Figure 5:
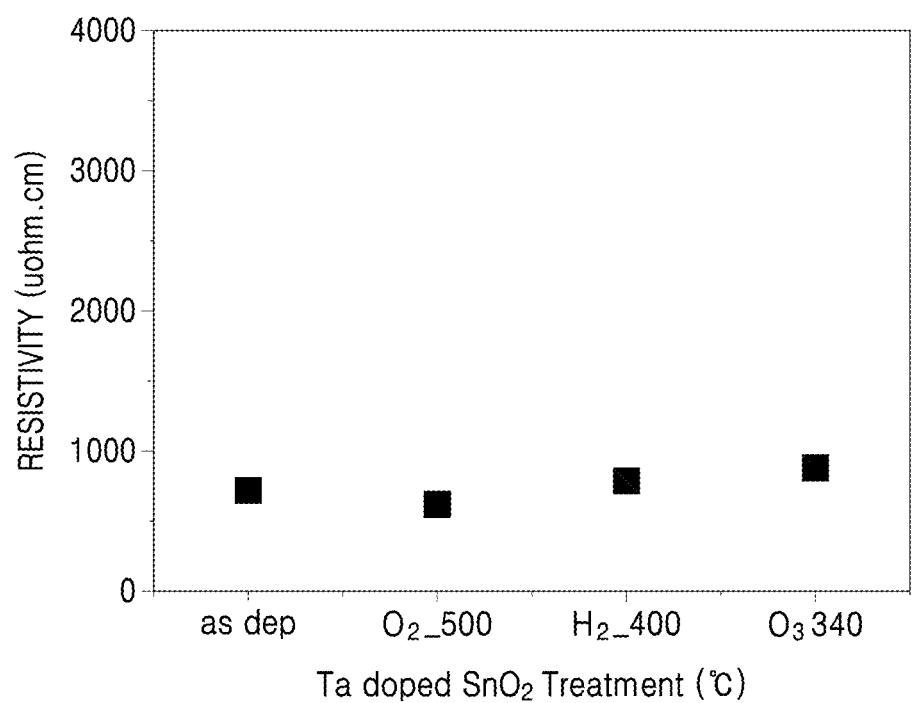
FIG. 5 is a graph showing variation in resistivity of the second conductive layer of FIG. 1 according to various treatments.
Figure 6:
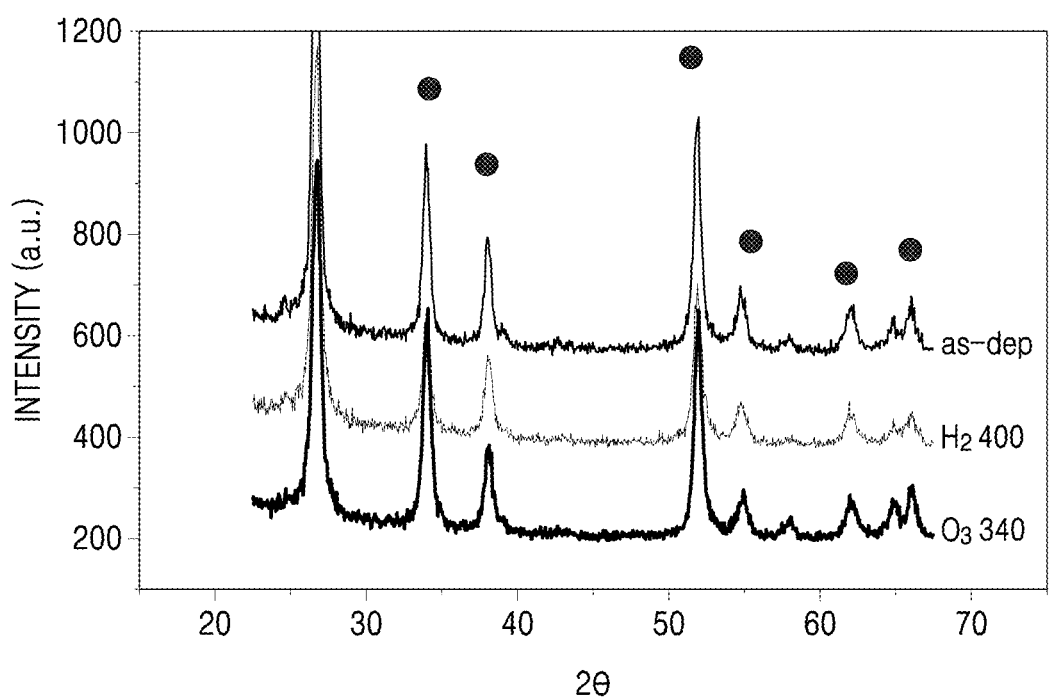
FIG. 6 is a graph showing a result of an experiment to confirm crystallinity of a dielectric layer of FIG. 1, on which various treatments are performed.

FIG. 1 schematically illustrates an example configuration of a capacitor 100 according to some example embodiments. FIG. 2 is a transmission electron microscope (TEM) image of an example configuration of the capacitor 100 of FIG. 1. FIG. 3 is a graph showing a variation in a work function of a lower electrode layer 10 according to types of materials included in a second conductive layer 12 of FIG. 1. FIG. 4 is a graph for describing variation in resistivity of the second conductive layer 12 of FIG. 1 according to types of materials included in the second conductive layer 12. FIG. 5 is a graph showing variation in resistivity of the second conductive layer 12 of FIG. 1 according to various treatments. FIG. 6 is a graph showing a result of an experiment to confirm crystallinity of a dielectric layer 10 of FIG. 1, on which various treatments are performed.

Referring to FIG. 1, the capacitor 100 according to some example embodiments may include the lower electrode layer 10 having a double-layer structure including a first conductive layer 11, which is conductive, and the second conductive layer 12 that is provided on the first conductive layer 11, a dielectric layer 20 provided on the second conductive layer 12 and including a rutile-phase oxide, and an upper electrode layer 30 provided on the dielectric layer 20.

The lower electrode layer 10 may have the double-layer structure formed by stacking the second conductive layer 12 on the first conductive layer 11. The second conductive layer 12, which may include a portion of the lower electrode layer 10 in direct contact with the dielectric layer 20, may perform a function as a seed layer which enables the dielectric layer 20 to have a rutile phase. For example, the second conductive layer 12 may include a conductive material exhibiting a rutile phase. The rutile phase may, for example, describe a crystalline phase similar to the crystalline phase of rutile phase $TiO_2$, and may, e.g., include a metal oxide of the ditetragonal dipyramidal crystal class. For example, the metal oxide with a rutile phase may comprise, e.g., metal atoms (and/or ions) forming a body-centered tetragonal crystal structure, such that the metal atoms may have a coordination number of 6, and the oxygen atoms may be a coordination number of 3.

The second conductive layer 12 may include, for example, a tin oxide (e.g., Tin(IV) oxide ("$SnO_2$")). The $SnO_2$ may be doped with a dopant including, e.g., a metal and/or a metal oxide.

In addition, the first conductive layer 11, which may include a portion of the lower electrode layer 10 which may be in direct contact with an external contact plug, may include a material that substantially does not cause an oxidation-reduction reaction on an interface with respect to the external contact plug (which is conductive).

Accordingly, the lower electrode layer 10 may generate, promote, and/or maintain a rutile phase of the dielectric layer 20 to enable the dielectric layer 20 to have high permittivity, and may mitigate and/or prevent a degradation in performance of the capacitor 100, as the lower electrode layer 10 does not cause an oxidation-reduction reaction with, e.g., an external contact plug.

The first conductive layer 11 may include various types of conductive materials. The first conductive layer 11 may include at least one of a metal, a metal oxide, and/or a metal nitride. For example, the first conductive layer 11 may include titanium nitride (TiN). The first conductive layer 11 including titanium nitride (TiN) may contact an external contact plug and may not substantially generate an oxidation-reduction reaction with the external contact plug.

In addition, in some example embodiments, the first conductive layer 11 may include a dopant. For example, the first conductive layer may include titanium nitride (TiN) doped with at least one of vanadium (V), niobium (Nb), tantalum (Ta), chromium (Cr), molybdenum (Mo), tungsten (W), platinum (Pt), rubidium (Ru), and/or iridium (Ir).

In some example embodiments, the second conductive layer 12 may include impurity-doped $SnO_2$. For example, the second conductive layer 12 may include $SnO_2$ doped with at least one of tantalum (Ta), niobium (Nb), manganese (Mn), antimony (Sb), and/or fluorine (F). As illustrated in FIG. 2, for example, the second conductive layer 12 (including $SnO_2$ doped with tantalum (Ta)) may be stacked on the first conductive layer 11 (including titanium nitride (TiN)). The second conductive layer 12 including impurity-doped $SnO_2$ may act as a seed layer enabling and/or promoting a rutile phase in the dielectric layer 20.

A doping concentration of an impurity included into $SnO_2$ included in the second conductive layer 12 may be from about 0.5 at % to about 10 at %. When the doping concentration of the impurity exceeds 10 at %, the resistance of the second conductive layer 12 may be excessively increased, and accordingly, the second conductive layer 12 may not be suitable for the lower electrode layer 10.

In addition, a work function of the second conductive layer 12 may be greater than a work function of the first conductive layer 11. The work function of the second conductive layer 12 can be sufficiently large, which may minimize and/or reduce the occurrence of leakage current from the dielectric layer 20. For example, the work function of the second conductive layer 12 may be about 4.3 eV to about 5 eV.

In some example embodiments, a thickness of the second conductive layer 12 may be about 1 nm to about 100 nm. Here, a sum of a thickness of the first conductive layer 11 and the thickness of the second conductive layer 12 may be less than 10 nm. When the thickness of the second conductive layer 12 is less than 1 nm, the second conductive layer 12 becomes too thin and the lower electrode 10 may be dominantly influenced by the first conductive layer 11, making the work function of the lower electrode layer 10 substantially equal to the work function of the first conductive layer 11. In these cases, the work function of the first conductive layer 11, which may be lower than the work function of the second conductive layer 12, becomes the overall work function of the lower electrode layer 10, and accordingly, the possibility of leakage current from the dielectric layer 20 may be increased.

As illustrated in FIG. 3, a work function of the first conductive layer 11 (including TiN) may be about 4.2 eV. In addition, a work function of the second conductive layer 12 including $SnO_2$ doped with 2 at %, 3 at %, and 5 at % of tantalum (Ta) may be about 4.5 eV, 4.6 eV, and 4.5 eV, respectively. Further, a work function of the second conductive layer 12 including $SnO_2$ doped with 2 at %, 3 at %, and 5 at % of niobium (Nb) may be about 4.7 eV, 4.5 eV, and 4.5 eV, respectively. As described above, the work function of the second conductive layer 12 including impurity-doped $SnO_2$ may be set to be greater than the work function of the first conductive layer 11 by 0.5 eV. However, the present disclosure is not limited thereto, and a difference between the work function of the second conductive layer 12 and the work function of the first conductive layer 11 may be, for example, greater than 0.5 eV.

The second conductive layer 12 may have a resistivity that is suitable for the lower electrode layer 10. For example, the resistivity of the second conductive layer 12 may be about 10 microohm ("$\mu\Omega$") cm to about 4000 $\mu\Omega$ cm. Referring to FIG. 4, the resistivity of the second conductive layer 12 including $SnO_2$ doped with 1 at % and 2 at % of tantalum (Ta) may be about 600 microohm-centimeter ("$\mu\Omega cm$") and about 250 $\mu\Omega cm$, respectively. In addition, the resistivity of the second conductive layer 12 including $SnO_2$ doped with 2 at % and 3 at % of niobium (Nb) may be about 1000 $\mu\Omega cm$ and about 3900 $\mu\Omega cm$, respectively.

The dielectric layer 20 may include a rutile-phase oxide. The dielectric layer 20 including a rutile-phase oxide may have a permittivity of about 60 to about 100. For example, the dielectric layer 20 may include titanium dioxide ($TiO_2$) of a rutile phase. As illustrated in FIG. 2, the dielectric layer 20 (e.g., including rutile-phase titanium dioxide ($TiO_2$)) may be stacked on the second conductive layer 12 (e.g., including $SnO_2$ doped with tantalum (Ta)). In these cases, a lattice constant of the dielectric layer 20 of a rutile phase may be about 3.24 Å.

The dielectric layer 20 may include dopant. For example, the dielectric layer 20 may include titanium dioxide ($TiO_2$)

including a rutile phase which is doped with at least one of aluminum (Al), gallium (Ga), germanium (Ge), lanthanum (La), and/or yttrium (Y).

The upper electrode layer 30 may include various types of conductive materials. The upper electrode layer 30 may include, for example, at least one of a metal, a metal oxide, and/or a metal nitride. For example, the upper electrode layer 30 may include titanium nitride (TiN). In addition, the upper electrode layer 30 may include a dopant. For example, the upper electrode may include titanium nitride (TiN) doped with at least one of vanadium (V), niobium (Nb), tantalum (Ta), chromium (Cr), molybdenum (Mo), tungsten (W), platinum (Pt), rubidium (Ru), and/or iridium (Ir). However, the present disclosure is not limited thereto, and the upper electrode layer 30 may include a conductive material having a perovskite structure including any one of strontium ruthenium oxide ("SRO"), strontium iridium oxide ("SIO"), strontium vanadium oxide ("SVO"), strontium niobium oxide ("SNO"), strontium cobalt oxide ("SCO"), strontium molybdenum oxide ("SMO") and/or the like.

In some example embodiments, in a process of manufacturing the capacitor 100 by stacking the lower electrode layer 10, the dielectric layer 20, and the upper electrode layer 30, an atomic layer deposition (ALD) method may be used. For example, in the process of manufacturing the capacitor 100 by using the ALD method, oxygen treatment, hydrogen treatment, ozone treatment, etc. may be performed on the second conductive layer 12 under various process temperatures. Even when these various treatments are performed, the resistivity of the second conductive layer 12 may be maintained at a suitable value for the lower electrode layer 10. For example, referring to FIG. 5, when no treatment is performed on the second conductive layer 12, the second conductive layer 12 may have a resistivity of about 750 $\mu\Omega$cm. When oxygen treatment is performed on the second conductive layer 12 at 500° C., the second conductive layer 12 may have a resistivity of about 600 $\mu\Omega$cm. When hydrogen treatment is performed on the second conductive layer 12 at 400° C., the second conductive layer 12 may have a resistivity of about 800 $\mu\Omega$cm. When ozone treatment is performed on the second conductive layer 12 at 340° C., the second conductive layer 12 may have a resistivity of about 900 $\mu\Omega$cm.

In addition, when various treatments such as hydrogen treatment and/or ozone treatment are performed on the second conductive layer 12, the second conductive layer 12 may still exhibit a rutile phase. For example, referring to FIG. 6, in these cases where no treatment is performed on the second conductive layer 12, hydrogen treatment is performed thereon at 400° C., and ozone treatment is performed thereon at 340° C., an x-ray diffraction (XRD) pattern of the second conductive layer 12 may exhibit peaks associated with the rutile phase. Therefore, as described above, even when various treatments are performed on the second conductive layer 12, the second conductive layer 12 may maintain a rutile phase, and thus, the rutile phase of the dielectric layer 20 stacked on the second conductive layer 12 may be maintained.

Figure 7:
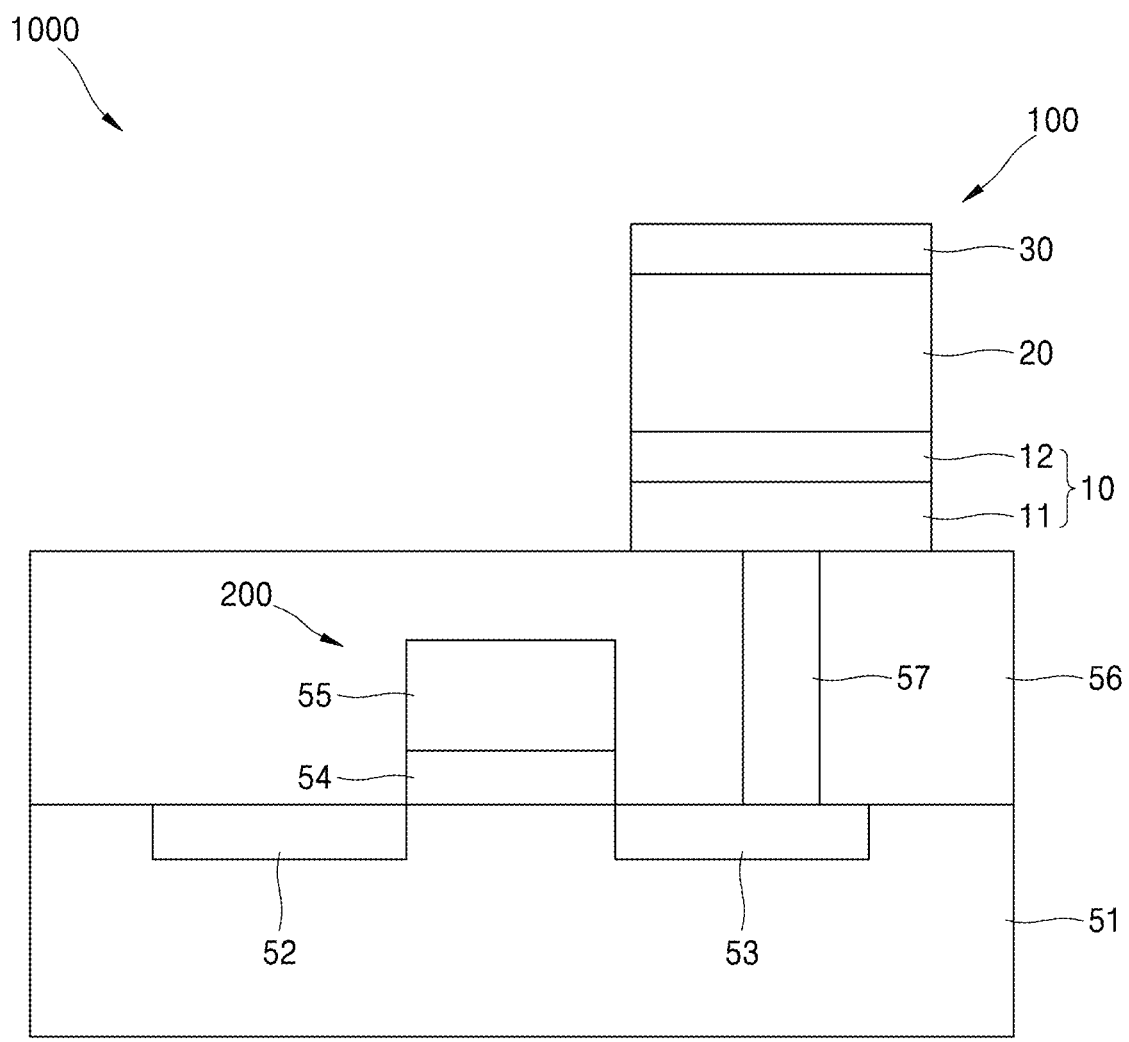
FIG. 7 schematically illustrates an example configuration of a memory device according to some example embodiments.

FIG. 7 schematically illustrates an example configuration of a memory device 1000 according to some example embodiments.

Referring to FIG. 7, the memory device 1000 may include a transistor 200 and a capacitor 100 connected to the transistor 200. For example, the memory device 1000 may include a substrate 51 including a source region 52 and a drain region 53, a transistor 200 including a gate insulating layer 54 and a gate electrode 55, an interlayer insulating layer 56 provided on the transistor 200, and the capacitor 100 provided on the interlayer insulating layer 56.

The source region 52 and the drain region 53 may be provided on and/or in the substrate 51. The source region 52 and the drain region 53 may be spaced apart from each other with a channel region therebetween. The source region 52 and the drain region 53 may be regions of the substrate 51, the regions being doped with an impurity.

The substrate 51 may be a semiconductor substrate and/or include a semiconductor. For example, the substrate 51 may include a silicon-containing material. The substrate 51 may include, for example, at least one of silicon, single crystal silicon, polysilicon, amorphous silicon, silicon germanium, single crystal silicon germanium, polycrystalline silicon germanium, carbon-doped silicon, a combination thereof, multiple layers thereof, and/or the like. For example, the substrate 51 may include a compound semiconductor substrate such as GaAs. Also, the substrate 51 may include a silicon on insulator (SOI) substrate.

The gate insulating layer 54 and the gate electrode 55 may be sequentially stacked between the source region 52 and the drain region 53 on the substrate 51. For example, the gate insulating layer 54 and the gate electrode 55 may form a pair stack on the channel region. The gate electrode 55 may include a conductive material. For example, the gate electrode 55 may include a metal and/or polysilicon. However, the present disclosure is not limited thereto, and the gate electrode 55 may include various conductive materials other than metal or polysilicon.

The gate insulating layer 54 may be arranged between the gate electrode 55 and the substrate 51. The gate insulating layer 54 may electrically insulate the substrate 51 from the gate electrode 55. The gate insulating layer 54 may include various types of insulating materials. For example, the gate insulating layer 54 may include at least one of silicon oxide (e.g., $SiO_2$), aluminum oxide (e.g., $Al_2O_3$), $TiO_2$, and/or the like.

The interlayer insulating layer 56 may be provided on the substrate 51 and may cover the gate electrode 55. The interlayer insulating layer 56 may include various types of insulating materials. For example, the interlayer insulating layer 56 may include silicon oxide (e.g., $SiO_2$), aluminum oxide (e.g., $Al_2O_3$), silicon nitride, silicon oxynitride, flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), amorphous fluorinated carbon, organo-silicate glass (OSG), polyimide, a polymeric material, a combination thereof, and/or the like.

The capacitor 100 may be provided on the interlayer insulating layer 56. The capacitor 100 may be substantially the same as the capacitor 100 of FIG. 1. For example, the capacitor 100 may include the lower electrode layer 10 including the first conductive layer 11 and the second conductive layer 12, the dielectric layer 20 provided on the lower electrode layer 10, and the upper electrode layer 30 provided on the dielectric layer 20. In some example embodiments, the second conductive layer 12 may include impurity-doped $SnO_2$.

A contact plug 57 may be provided between the lower electrode layer 10 and, e.g., the drain region 53. The capacitor 100 may be electrically connected to the drain region 53 through the contact plug 57. However, the present disclosure is not limited thereto, and the contact plug 57 may be provided between the lower electrode layer 10 and the source region 52, and accordingly, the capacitor 100 may be electrically connected to the source region 52 through the contact plug 57.

The contact plug 57 may be formed to pass through the interlayer insulating layer 56 and to electrically connect the capacitor 100 (e.g., via the lower electrode layer 10) and the transistor 200 (e.g., via the drain region 53) to each other, and may include a conductive material (e.g., a metal).

For example, the contact plug 57 may include tungsten (W). The contact plug 57 including tungsten (W) may contact the first conductive layer 11. In some embodiments, such as wherein the first conductive layer 11 includes titanium nitride (TiN), the first conductive layer 11 may isolate the conductive material of the contact 57 from oxygen included in the second conductive layer 12, thereby mitigating (and/or preventing) the formation of an oxide (e.g., WO) at the interface between the lower electrode 10 and the contact 57.

Figure 8:
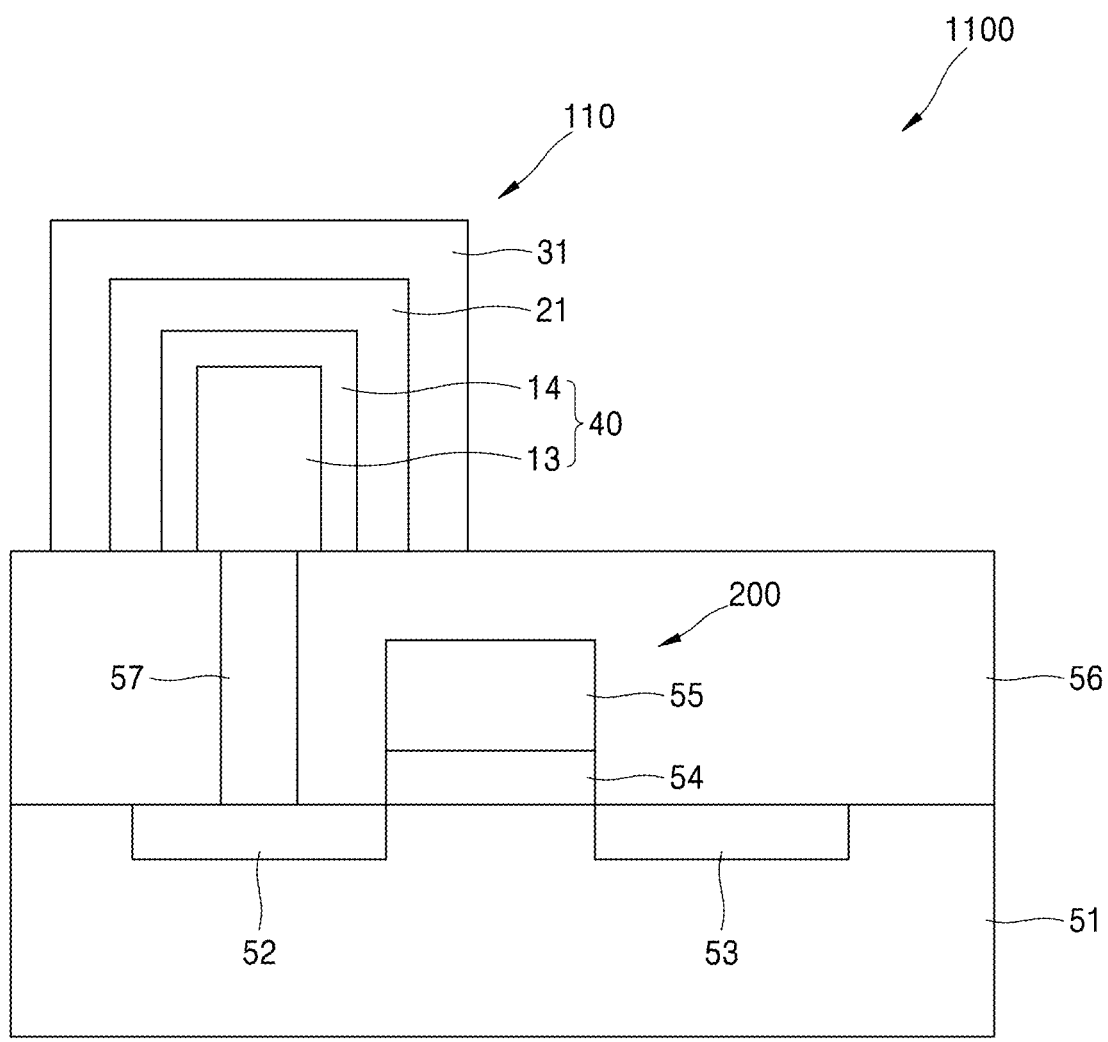
FIG. 8 schematically illustrates an example configuration of a memory device according to some example embodiments.

FIG. 8 schematically illustrates an example configuration of a memory device 1100 according to another embodiment. The memory device 1100 of FIG. 8 may be substantially the same as the memory device 1000 of FIG. 7, except that a capacitor 110 has a different configuration from the capacitor 100 of FIG. 7. In the description of FIG. 8, description of details that are the same as those of FIG. 7 is omitted.

Referring to FIG. 8, the memory device 1100 may include the transistor 200 and the capacitor 110 connected thereto. For example, the memory device 1100 may include the substrate 51 including the source region 52 and the drain region 53, the transistor 200 including the gate insulating layer 54 and the gate electrode 55, the interlayer insulating layer 56 provided on the transistor 200, and the capacitor 110 provided on the interlayer insulating layer 56.

The capacitor 110 may include a lower electrode layer 40 including a first conductive layer 13 and a second conductive layer 14, a dielectric layer 21 provided on the lower electrode layer 40, and an upper electrode layer 31 provided on the dielectric layer 21.

Materials included in the first conductive layer 13, the second conductive layer 14, the dielectric layer 21, and the upper electrode layer 31 may be substantially identical to those included in the first conductive layer 11, the second conductive layer 12, the dielectric layer 20, and the upper electrode layer 30, respectively. For example, the second conductive layer 14 may include impurity-doped $SnO_2$. Hereinafter, structural differences between the capacitor 110 of FIG. 8 and the capacitor 100 of FIG. 1 will be described in detail.

The first conductive layer 13 may be provided on the interlayer insulating layer 56 to contact the contact plug 57. The second conductive layer 14 may cover sides and an upper surface of the first conductive layer 13. In addition, both ends of the second conductive layer 14 may contact the interlayer insulating layer 56. Accordingly, the lower electrode layer 40 may have a core-shell structure in which the first conductive layer 13 is a core and the second conductive layer 14 is a shell. The dielectric layer 21 may cover sides and an upper surface of the second conductive layer 14. Also, both ends of the dielectric layer 21 may contact the interlayer insulating layer 56. The upper electrode layer 31 may cover sides and an upper surface of the dielectric layer 21. In addition, both ends of the upper electrode layer 31 may contact the interlayer insulating layer 56. Accordingly, the capacitor 110 may be considered to have a core-shell structure.

Figure 9:
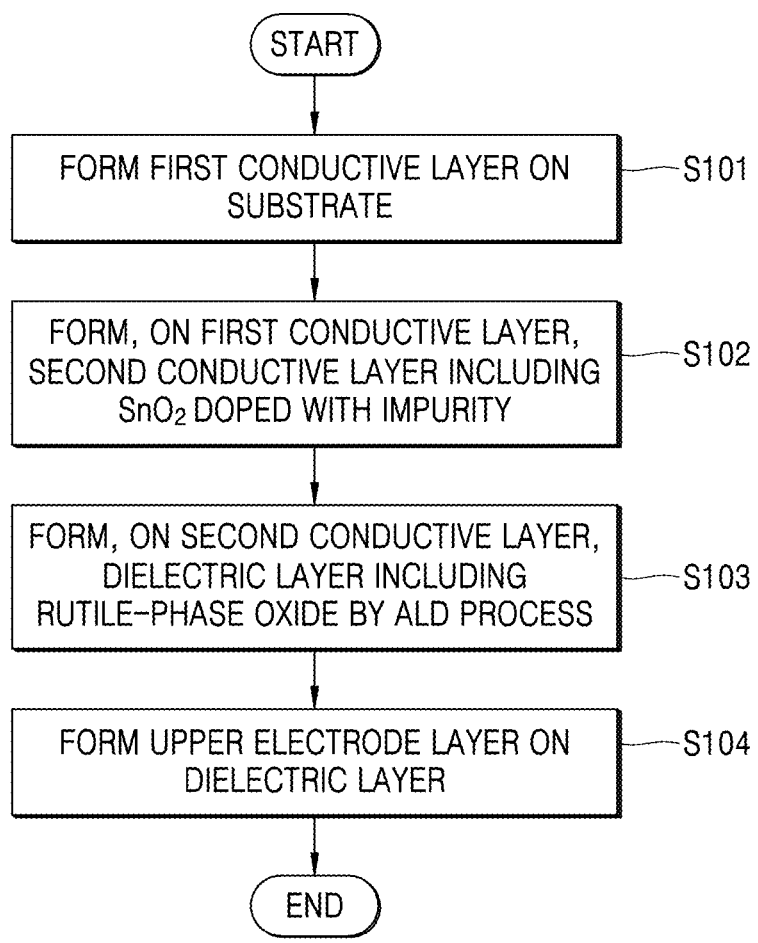
FIG. 9 is a flowchart of a method of manufacturing a capacitor, according to some example embodiments.

FIG. 9 is a flowchart of a method of manufacturing a capacitor, according to some example embodiments.

Referring to FIG. 9, the method of manufacturing a capacitor, according to some example embodiments, may include forming a first conductive layer on a substrate (S101); forming, on the first conductive layer, a second conductive layer including impurity-doped $SnO_2$ (S102); forming, on the second conductive layer, a dielectric layer including an oxide having a rutile phase (S103); and forming an upper electrode layer on the dielectric layer (S104).

In the forming of the first conductive layer on the substrate (S101), the first conductive layer may be formed on the substrate using various deposition methods such as a chemical vapor deposition (CVD) method and/or an ALD method.

The substrate may be, e.g., a semiconductor substrate and/or include a semiconductor material. The substrate may include, for example, a silicon-containing material. In some example embodiments, the substrate may include at least one of silicon, single crystal silicon, polysilicon, amorphous silicon, silicon germanium, single crystal silicon germanium, polycrystalline silicon germanium, carbon-doped silicon, a combination thereof, multiple layers thereof, and/or the like. For example, the substrate may include a compound semiconductor substrate such as GaAs. Also, the substrate may include an SOI substrate.

In addition, the first conductive layer provided on the substrate may include various type of conductive materials. The first conductive layer may include at least one of a metal, a metal oxide, and a metal nitride. For example, the first conductive layer may include titanium nitride (TiN). Furthermore, the first conductive layer may include titanium nitride (TiN) doped with at least one of vanadium (V), niobium (Nb), tantalum (Ta), chromium (Cr), molybdenum (Mo), tungsten (W), platinum (Pt), rubidium (Ru), and/or iridium (Ir).

In the forming of the second conductive layer on the first conductive layer (S102), the second conductive layer may be formed on the first conductive layer using various deposition methods such as a CVD method and/or an ALD method.

The second conductive layer may include impurity-doped $SnO_2$. For example, the second conductive layer may include $SnO_2$ doped with at least one of tantalum (Ta), niobium (Nb), manganese (Mn), antimony (Sb), and fluorine (F).

In the forming of the dielectric layer on the second conductive layer (S103), the dielectric layer may be formed on the second conductive layer using various deposition methods such as a CVD method or an ALD method.

The dielectric layer may include a rutile-phase oxide. For example, the second conductive layer may act as a seed layer, thereby enabling and/or promoting the formation of a rutile-phase in the oxide of the dielectric layer. The dielectric layer including a rutile-phase oxide may have a permittivity of about 60 to about 100. For example, the dielectric layer may include titanium dioxide ($TiO_2$) of a rutile phase. The dielectric layer may include titanium dioxide ($TiO_2$) that is of a rutile phase and doped with at least one of aluminum (Al), gallium (Ga), germanium (Ge), lanthanum (La), and yttrium (Y).

For example, the dielectric layer may be formed under an ALD process, in which case the temperature of the ALD process may be from about 300° C. to about 340° C. The dielectric layer formed using an ALD method at a process temperature of about 300° C. to about 340° C. may have a rutile phase.

In the forming of the upper electrode layer on the dielectric layer (S104), the upper electrode layer may be formed on the dielectric layer by various deposition methods such as a CVD method and/or an ALD method.

The upper electrode layer may include various types of conductive materials. In some example embodiments, the upper electrode layer may include at least one of a metal, a metal oxide, and/or a metal nitride. For example, the upper electrode layer may include titanium nitride (TiN). In addition, the upper electrode layer may include titanium nitride (TiN) doped with at least one of vanadium (V), niobium (Nb), tantalum (Ta), chromium (Cr), molybdenum (Mo), tungsten (W), platinum (Pt), rubidium (Ru), and iridium (Ir). However, the present disclosure is not limited thereto, and the upper electrode layer may include a conductive material having a perovskite structure including any one of SRO, SIO, SVO, SNO, SCO, SMO, and/or the like.

According to the various embodiments of the present disclosure, a capacitor including a lower electrode layer having a double-layer structure in which a second conductive layer including impurity-doped $SnO_2$ is stacked on a first conductive layer, a memory device including the capacitor, and a method of manufacturing the capacitor may be provided.

According to the various embodiments of the present disclosure, by adjusting a concentration of an impurity doped into the second conductive layer, the high permittivity of a dielectric layer, which is in contact with the second conductive layer, may be maintained and the occurrence of leakage current may be reduced.

According to the various embodiments of the present disclosure, a capacitor including a lower electrode layer having a structure in which an oxidation reaction at an interface between the lower electrode and a contact is minimized and/or prevented, a memory device including the capacitor, and a method of manufacturing the capacitor may be provided.

It should be understood that the example embodiments described herein should be considered in a descriptive sense only and not for purposes of limitation. Descriptions of features or aspects within each embodiment should typically be considered as available for other similar features and/or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
a lower electrode layer including a first conductive layer and a second conductive layer on the first conductive layer, the second conductive layer including $SnO_2$ doped with an impurity;
a dielectric layer on the second conductive layer, the dielectric layer including a rutile-phase oxide; and
an upper electrode layer on the dielectric layer,
wherein the impurity of the second conductive layer comprises at least one of niobium (Nb), or manganese (Mn), and
wherein a doping concentration of the impurity with respect to the second conductive layer is included in a range from 0.5 at % to 10 at %.

2. The capacitor of claim 1, wherein a work function of the second conductive layer is included in a range from 4.3 eV to 5 eV.

3. The capacitor of claim 1, wherein a thickness of the second conductive layer is included in a range from 1 nm to 100 nm.

4. The capacitor of claim 1, wherein a resistivity of the second conductive layer is included in a range from 10 μΩcm to 4000 μΩcm.

5. The capacitor of claim 1, wherein a sum of a thickness of the first conductive layer and a thickness of the second conductive layer is less than 10 nm.

6. The capacitor of claim 1, wherein a permittivity of the dielectric layer is included in a range from 60 to 100.

7. The capacitor of claim 1, wherein the rutile-phase oxide comprises titanium dioxide ($TiO_2$).

8. The capacitor of claim 1, wherein
the rutile-phase oxide comprises titanium dioxide ($TiO_2$), and
the dielectric layer includes a dopant, the dopant comprising at least one of aluminum (Al), gallium (Ga), germanium (Ge), lanthanum (La), or yttrium (Y).

9. The capacitor of claim 1, wherein the first conductive layer comprises titanium nitride (TiN).

10. The capacitor of claim 1, wherein the first conductive layer comprises titanium nitride (TiN) doped with at least one of vanadium (V), niobium (Nb), tantalum (Ta), chromium (Cr), molybdenum (Mo), tungsten (W), platinum (Pt), rubidium (Ru), or iridium (Ir).

11. A memory device comprising:
a transistor including a source region and a drain region spaced apart from each other, a channel region between the source region and the drain region, and a gate electrode on the channel region;
a capacitor comprising
a lower electrode layer including a first conductive layer and a second conductive layer on the first conductive layer, the second conductive layer including $SnO_2$ doped with an impurity,
a dielectric layer on the second conductive layer, the dielectric layer including a rutile-phase oxide, and
an upper electrode on the dielectric layer; and
a contact plug electrically connecting the first conductive layer of the lower electrode to at least one of the drain region or the source region,
wherein the impurity of the second conductive layer comprises at least one of niobium (Nb), or manganese (Mn), and
wherein a doping concentration of the impurity with respect to the second conductive layer is included in a range from 0.5 at % to 10 at %.

12. The memory device of claim 11, wherein the first conductive layer comprises titanium nitride (TiN).

* * * * *